United States Patent [19]

Ishii

[11] Patent Number: 4,769,339
[45] Date of Patent: Sep. 6, 1988

[54] METHOD OF MANUFACTURING A FIELD EFFECT TRANSISTOR DEVICE HAVING A MULTILAYER GATE ELECTRODE

[75] Inventor: Tetsuo Ishii, Fujisawa, Japan

[73] Assignee: Kabushiki Kaisha Toshiba, Kawasaki, Japan

[21] Appl. No.: 13,794

[22] Filed: Feb. 12, 1987

Related U.S. Application Data

[62] Division of Ser. No. 685,560, Dec. 24, 1984, abandoned.

[30] Foreign Application Priority Data

Dec. 26, 1983 [JP] Japan .................................. 58-246151

[51] Int. Cl.[4] .................. H01L 21/265; H01L 29/80
[52] U.S. Cl. ................................ 437/39; 437/41; 437/177; 357/22
[58] Field of Search .......................... 357/15, 22; 148/DIG. 139; 437/39, 41, 177

[56] References Cited

U.S. PATENT DOCUMENTS

| | | | |
|---|---|---|---|
| 4,312,680 | 1/1982 | Hsu | 148/1.5 |
| 4,358,340 | 11/1982 | Fu | 156/643 |
| 4,489,480 | 12/1984 | Martin et al. | 29/576 B |
| 4,559,693 | 12/1985 | Kamei | 437/39 |
| 4,592,577 | 9/1985 | Jackson | 29/571 |
| 4,645,563 | 2/1987 | Terada | 156/643 |
| 4,700,455 | 10/1987 | Shimada et al. | 437/39 |

FOREIGN PATENT DOCUMENTS 0177129 4/1986 European Pat. Off. ............. 437/41

*Primary Examiner*—Olik Chaudhuri
*Attorney, Agent, or Firm*—Finnegan, Henderson, Farabow, Garrett and Dunner

[57] ABSTRACT

This Schottky barrier gate field effect transistor has N+-type source and drain regions formed in the surface area of a GaAs semi-insulation substrate, a channel region formed between the source and drain regions, and a gate electrode formed on this channel region. Particularly, in this Schottky barrier gate field effect transistor, the gate electrode has a first metal portion, which is preferably in Schottky contact with the channel region, and a second metal portion, which stably affixes to the first metal portion. The first and second metal portions are fixed to an insulative portion formed on the channel region.

7 Claims, 3 Drawing Sheets

METHOD OF MANUFACTURING A FIELD EFFECT TRANSISTOR DEVICE HAVING A MULTILAYER GATE ELECTRODE

This is a division of application Ser. No. 685,560, filed 12/24/84, now abandoned.

BACKGROUND OF THE INVENTION

The present invention relates to a semiconductor device for a super high frequency and, more particularly, to a Schottky barrier type field effect transistor and a method of manufacturing the same.

FIG. 1A to 1C show manufacturing steps of a conventional Schottky barrier gate field effect transistor (SBGFET). This SBGFET shown in FIG. 1C has a semi-insulation substrate 10 of GaAs. Source and drain regions 12 and 14 are formed in the surface area of the substrate 10. A channel region 16 of this SBGFET is formed between the source and drain regions 12 and 14. A gate electrode 18 is formed on the channel region 16 in Schottky contact therewith. The source, drain and channel regions 12, 14 and 16 include N-type impurities, and the impurity concentrations in the regions 12 and 14 are higher than that in the region 16.

Generally, the operating characteristic of the SBGFET in the high frequency range is easily influenced by a parasitic resistance. In particular, in the case of the above SBGFET, the impurity concentration in the channel region 16 is lower than those in the source and drain regions 12 and 14, so that the operating characteristic depends upon a source parasitic resistance RS that is proportional to a distance LS between the source region 12 and the gate electrode 18 and upon a drain parasitic resistance RD that is proportional to a distance LD between the gate electrode 18 and the drain electrode 14. In order to allow this SBGFET to have a good transfer conductance, it is necessary to set the distances LS and LD to be short and thereby to limit the source and drain parasitic resistances RS and RD to sufficiently low values. In addition, in order to permit the SBGFET to have a good gate withstanding voltage, it is necessary to set the distance LD to be long. As a result, to manufacture the SBGFET with high performance, the distances LS and LD have to be set as short as possible within a range where a sufficient gate withstanding voltage is secured.

A method of manufacturing the SBGFET of FIG. 1C will now be described. First, N-type impurities of a low concentration are doped in the GaAs semi-insulation substrate 10, thereby forming an N-type region 16A shown in FIG. 1A. Thereafter, the N-type impurities of a high concentration are ion-implanted into the N-type region 16A and annealed, so that the N+-type source and drain regions 12 and 14 shown in FIG. 1B are formed. At this time, a part of an N-type region 16A remaining between the source and drain regions 14 and 16 is used as the channel region 16. The surfaces of the source, drain and channel regions 12, 14 and 16 are covered by a photo resist through an SiO2 film used as a spacer. Further, parts of the photo resist and SiO2 film are etched using a mask pattern in order to expose the central portion of the channel region 16. A metal layer is formed on the photo resist and on the exposed portion of the channel region 16. After that, the metal layer is removed with use of the lift-off technique, excluding the portion on the junction with the channel region 16, due to the melting of this photo resist subjected to the etching process. The metal layer on the channel region 16 is used as the gate electrode 18.

On the other hand, in the above SBGFET, the position of the gate electrode 18 is specified by the mask pattern, so that the distances LS and LD of this SBGFET are influenced due to an error in mask alignment. If the distances LS and LD are set without taking account of this error, a number of defective SBGFETs, each having a low gate withstanding voltage or low transfer conductance, will have been produced due to the actual manufacturing. To prevent the reduction in yield, the distances LS and LD in the SBGFET shown in FIG. 1C have been conventionally set to long values of about 2 μm.

On the other hand, FIG. 2B shows a conventional SBGFET which is produced by another manufacturing method than the SBGFET of FIG. 1C. In the SBGFET of FIG. 2B, N-type impurities of a low concentration are doped into the GaAs semi-insulation substrate 10, thereby forming the N-type region 12A shown in FIG. 2A. Next, as shown in FIG. 2A, a gate electrode 20 is formed on the N-type region 12A, and the N-type impurities of a high concentration are ion-implanted into the N-type region 12A using the gate electrode 20 as a mask and are annealed. Thus, as shown in FIG. 2B, N+-type source and drain regions 22 and 24 are formed in the surface area of the GaAs semi-insulation substrate 10. A part of the N-type region 12A remaining between the source and drain regions 22 and 24 is used as a channel region 26.

In the SBGFET of FIG. 2B, the source and drain regions 22 and 24 are formed for ion-implantation by means of a self-alignment method using the gate electrode 20 as a mask. Due to this, the SBGFET in which the parasitic resistances RS and RD have enough small values can be manufactured without considering the error in mask alignment, as in the SBGFET of FIG. 1C. However, in this SBGFET, there is a case where the impurities of a high concentration are laterally diffused at the time of annealing, so that the source region 22 comes into contact with the drain region 24. Consequently, deterioration in the gate withstanding voltage and variation in the threshold voltage will occur.

SUMMARY OF THE INVENTION

It is an object of the present invention to provide a semiconductor device having a sufficient gate withstanding voltage and an excellent operation characteristic in a high frequency range and to provide a manufacturing method which can manufacture such a semiconductor device with a high yield.

According to the invention, the following semiconductor device is provided. This semiconductor device comprises: a semi-insulation substrate; source and drain regions formed in the surface area of this semi-insulation substrate; a channel region which is formed between these source and drain regions; an insulation layer formed on this channel region; and a gate electrode which has a first metal layer formed in Schottky contact with the channel region and a second metal layer formed on this first metal layer and fixed to the insulation layer.

According to this invention, a method of manufacturing a semiconductor device is provided. This manufacturing method comprises: a first step of forming a first region having a low impurity concentration in the surface area of a semi-insulation substrate; a second step of forming a first metal portion on this first region in Schottky contact with this first region; a third step of forming a second metal portion on the first metal portion; a fourth step of forming on the first region an insulative portion for holding the first and second metal portions; and a fifth step of forming second and third regions each having a high impurity concentration on the surface area of the substrate using the first and second metal portions and insulative portion as the masks.

In this invention, the first and second metal portions constitute the gate electrode of the Schottky barrier gate field effect transistor, while the second and third regions constitute the source and drain of this transistor, respectively. In the formation of the third and fourth regions, the use of the first and second metal portions and insulative portion as the masks allows the distance between the gate and source and the distance between the gate and drain to be accurately specified due to the self alignment. On the other hand, since the first and second metal portions are supported by the insulative portion, even in the case where the widths of these first and second metal portions are very short, they are not peeled off from the substrate. When the above first and second widths are short, the mutual conductance of the SBGFET becomes high, and the excellent operating characteristic in a high frequency range is obtained. Further, since the gate electrode is formed by the first and second metal portions, a variation in Schottky characteristic is reduced, thereby enabling the threshold voltage of the SBGFET to be easily set.

DETAILED DESCRIPTION OF THE PREFERRED EMBODIMENTS

Figure 1A:
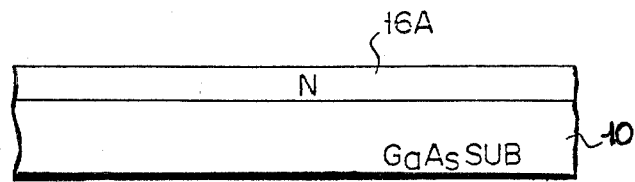
FIGS. 1A to 1C are diagrams for explaining a structure of a conventional GaAs Schottky barrier gate field effect transistor (SBGFET)
Figure 1B:
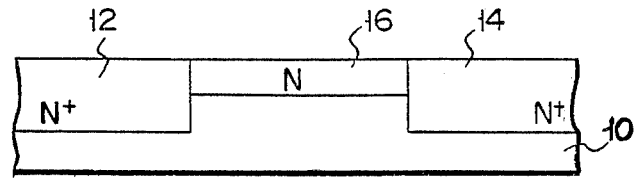
Figure 1C:
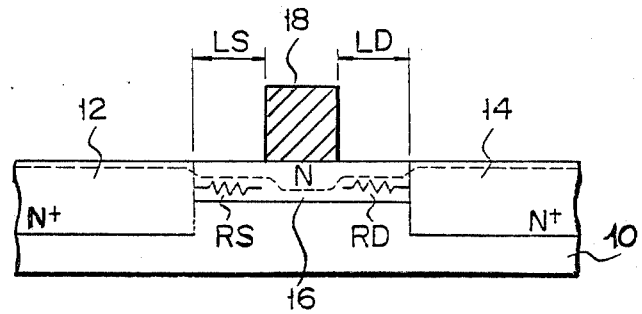
Figure 2A:
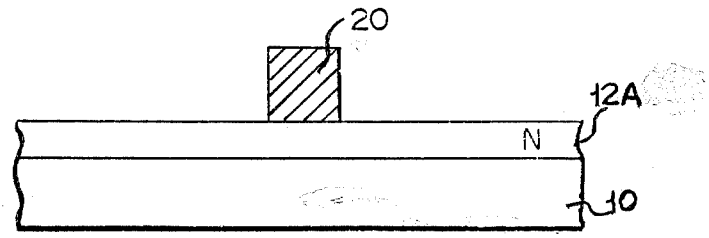
FIGS. 2A and 2B show a conventional GaAs Schottky barrier gate field effect transistor having relatively small parasitic resistances between the gate and source and between the gate and drain.
Figure 2B:
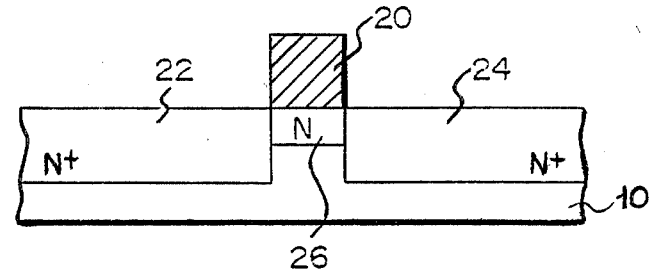
Figure 3A:
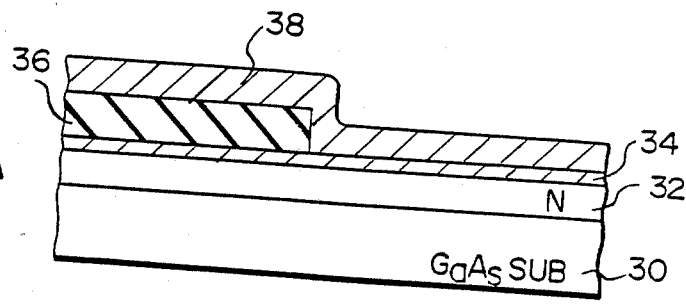
FIGS. 3A to 3G show a GaAs Schottky barrier gate field effect transistor in an embodiment, according to the invention, on the basis of the manufacturing steps.
Figure 3B:
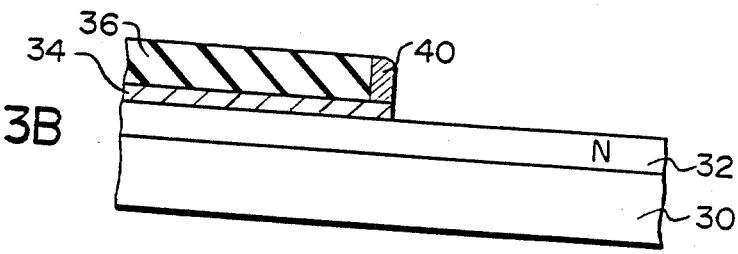
Figure 3C:
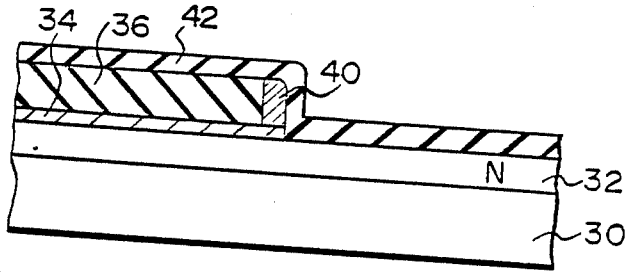
Figure 3D:
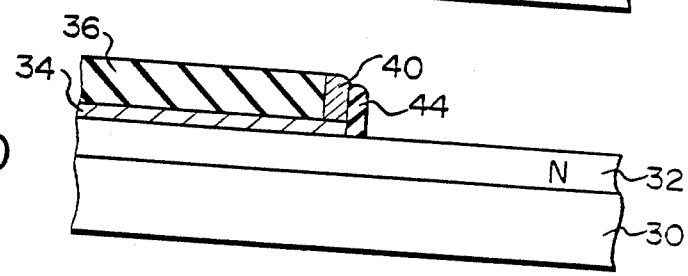
Figure 3E:
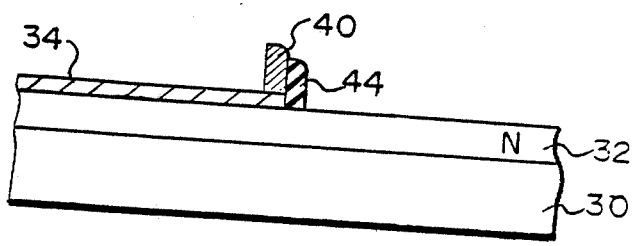
Figure 3F:
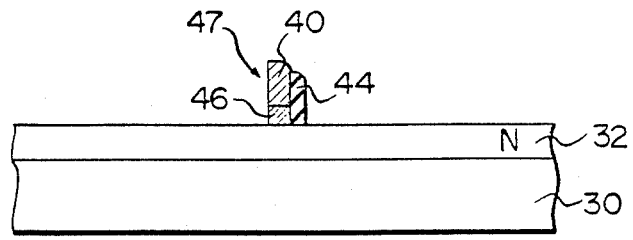
Figure 3G:
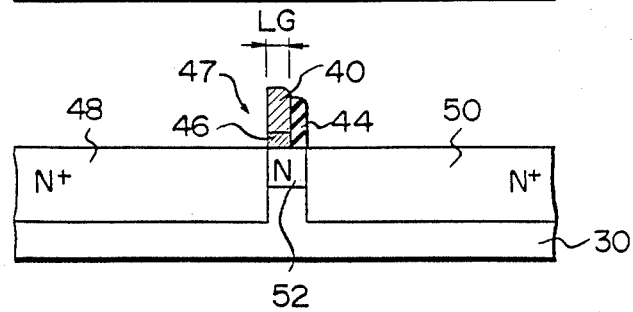

A Schottky barrier gate field effect transistor (SBGFET) in one embodiment of the invention will now be explained. FIGS. 3A to 3G show a structure of this SBGFET in accordance with the manufacturing steps. First, referring to FIG. 3A, this SBGFET is provided with a GaAs semi-insulation substrate 30, and an N-type region 32 with a low impurity concentration of, e.g., $3 \times 10^{16}/cm^3$ is formed in the surface area of the substrate 30 due to the doping. This N-type region 32 has a thickness of, e.g., 1.5 $\mu$m and is covered by a first metal layer 34. This first metal layer 34 is formed on the substrate 30 in Schottky contact therewith. In particular, the first metal layer 34 is formed of a metal material such as an alloy of titanium and tungsten (TiW) which is not melted even at the annealing temperature of about 800° C. A support layer 36 is formed on the first metal layer 34 and has a thickness of, e.g., 0.8 $\mu$m. The support layer 36 is formed of, for example, a $Si_3N_4$ insulation film. It is also possible to use a resist film or a metal film. The support layer 36 is covered by a photo resist. This photo resist is used as the mask for etching the support layer 36 by a mixed gas of $CF_4$ and $H_2$. In this etching process, parts of the layer 36 are removed, so that the surface of the first metal layer 34 is partially exposed again, and a side surface which is perpendicular to the first metal layer 34 is formed in the remaining part of the support layer 36. A second metal layer 38 is formed on the exposed portion of the first metal layer 34 and on the support layer 36 due to a sputtering method. The second metal layer 38 has a thickness of about 0.3 $\mu$m and is formed of a metal material such as Au, which can be stably joined to the first metal layer 34. The second metal layer 38 is subjected to the anisotropical etching process such as ion-milling or the like under the Ar atmosphere. As shown in FIG. 3B to partially expose the N-type region 32, this etching process progresses vertically toward the upper surface of the substrate 30 and is continued until the N-type region 32 is exposed. Due to this, the surface area of the support layer 36 is etched by about 0.1 $\mu$m, and a portion 40 of the second metal layer 38 is left along the side surface of the support layer 36 so as to have a width of 0.2 $\mu$m without being etched. Thereafter, as shown in FIG. 3C, the exposed portions of the support layer 36, portion 40, and N-type region 32 are covered by an insulation layer 42. The insulation layer 42 is the oxide film having a thickness of about 0.15 $\mu$m. The insulation layer 42 is subjected to the anisotropical etching process in a vertical direction to the upper surfaces of the support layer 36, portion 40, and N-type region 32. This etching process is continued until the surfaces of the support layer 36, portion 40, and N-type region 32 are exposed. Due to this, a portion 44 of the insulation layer 42 is left along the side surfaces of the first and second metal layers 34 and 40 so as to have a width of about 0.1 $\mu$m, as shown in FIG. 3D. As shown in FIG. 3E, the support layer 36 is removed from covering the first metal layer 34 due to the plasma etching process using $CF_4$ gas and $H_2$ gas. Further, the first metal layer 34 is subjected to the reactive ion-etching process using the metal portion 40 and the insulative portion 44 as the masks. A gas based on, e.g., $CF_4$ is used in this etching process. Thus, the first metal layer 34, excluding a portion 46 under the metal portion 40, is removed from over the N-type region 32 as shown in FIG. 3F. The width of the metal portion 46 is set to 0.2 $\mu$m in correspondence to the metal portion 40. The metal portions 40 and 46 are used as a gate electrode 47 of the SBGFET. $N^+$-type regions 48 and 50 shown in FIG. 3G are formed in the surface area of the substrate 30 due to the ion-implantation and annealing, and correspond to the source and drain regions of the SBGFET, respectively. In this ion-implantation, silicon ions are implanted into the N-type region 32 using the metal portions 40 and 46 (i.e., gate electrode 47) and insulative portion 44 as the masks. In the annealing process after this ion-implantation, the GaAs semi-insulation substrate 30 is heated to a temperature of about 800° C. for ten minutes. Each of the $N^+$-type regions 48 and 50 has a high impurity concentration of about $3 \times 10^{16}/cm^3$ and a thickness of about 40 $\mu$m.

Source and drain electrodes (not shown) are formed on the $N^+$-type regions 48 and 50 through an insulation layer.

On the other hand, the first metal layer 32 may be formed as a multi-layer structure to improve the Schottky characteristic.

In this embodiment, the gate electrode of the SBGFET is constituted by the metal portions 40 and 46 and the source and drain regions correspond to the N+-type regions 48 and 50, respectively. Therefore, as described above, in the case where the N+-type regions 48 and 50 are formed by means of the self-alignment using the metal portions 40 and 46 and insulative portion 44 as the mask pattern, the distance LS between the gate and source of the SBGFET and the distance LD between the gate and drain are accurately specified. In particular, in this SBGFET, the gate withstanding voltage is determined in correspondence with the width of the insulative portion 44, and the width of the portion 44 can be easily controlled when the insulation layer 42 is formed. Since the distance LS is set to substantially "0", the source parasitic resistance RS is very low. Further, in the embodiment, although the gate electrode is formed so as to have an extremely short width LG of 0.2 μm since it is firmly fixed to the insulative portion 44 on the N-type region 32, the possibility of failure of the SBGFET due to the removal of the gate is low.

In addition, since the gate electrode is constituted by the metal portions 40 and 46, it is difficult to cause a variation in the Schottky characteristic. Thus, the threshold voltage of the SBGFET can be easily set. In this way, the reduction of the width LG of the gate electrode 47 causes a mutual conductance $g_m$ of the SBGFET to be increased and allows the response operating speed to become high.

Figure 4A:
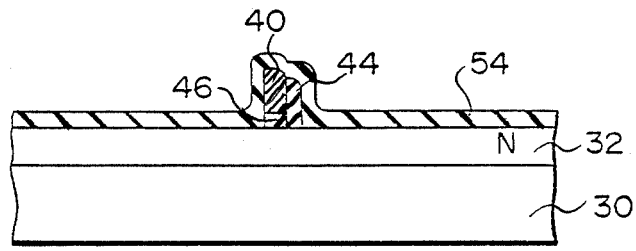
FIGS. 4A to 4C show a GaAs Schottky barrier gate field effect transistor in another embodiment according to the invention.
Figure 4B:
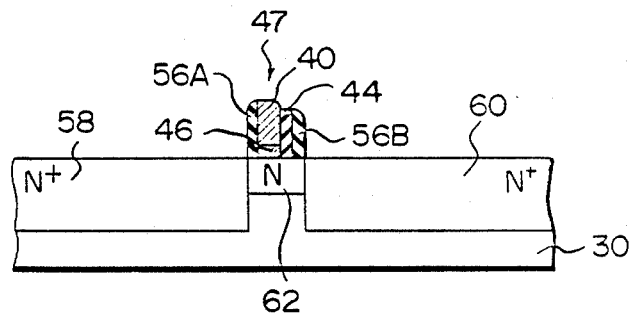
Figure 4C:
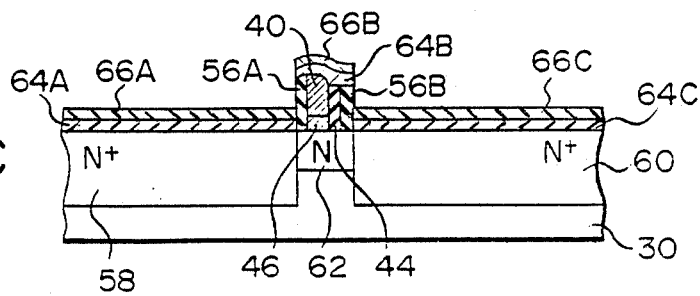

FIGS. 4A to 4C show an SBGFET in another embodiment of the invention on the basis of the manufacturing steps. In the drawings, the same parts and elements as those in the foregoing embodiment are designated by the same reference numerals. After the manufacturing step shown in FIG. 3A, the N-type region 32, metal portions 40 and 46, and insulative portion 44 are covered by an insulation layer 54 as shown in FIG. 4A. The insulation layer 54 is an oxide film having a thickness of about 0.08 μm. This insulation layer 54 is subjected to the anisotropical etching process using a mixed gas of $CH_4$ and $H_2$. Thus, insulative portions 56A and 56B each having a thickness of 0.05 μm are formed on both sides of the gate electrode (i.e., metal portions 40 and 46) and insulative portion 44. N+-type regions 58 and 60 shown in FIG. 4B are formed due to a diffusing method of impurities using the gate electrode (i.e., metal portions 40 and 46) and insulative portions 44, 56A and 56B as the masks. Source and drain regions of the SBGFET correspond to the N+-type regions 58 and 60, respectively. On the other hand, in the case of joining a wiring layer to this SBGFET, metal layers 64A, 64B and 64C are formed on the N+-type regions 58 and 60 and on the metal portion 40 by using the heights of the insulative portions 56A and 56B; furthermore, metal layers 66A, 66B and 66C are formed on the metal layers 64A, 64B and 64C. In this case, for instance, germanium Ge may be used as the metal layers 64A to 64C and, e.g., gold (Au) may be used as the metal layers 66A to 66C.

What is claimed is:

1. A method of manufacturing a field effect transistor device comprising:
    a first step of forming an active region in a surface of a semiconductor substrate;
    a second step of forming a multilayer gate electrode on and in Schottky contact with said active region;
    a third step of forming a first insulative spacer on said active region and in fixed contact with a side surface of said gate electrode;
    a fourth step of uniformly depositing an insulative layer on said active region, gate electrode and first insulative spacer and anisotropically etching said insulative layer until the active region is exposed to provide portions of said insulative layer in fixed contact with an opposite side surface of said gate electrode and on side surfaces of said first insulative spacer to form second and third insulative spacers, respectively; and
    a fifth step of forming source and drain regions in said active region by using as a mask said first, second and third spacers and gate electrode with said source and drain regions having a higher carrier concentration than said active region, said source region being spaced from said gate electrode by a first distance substantially equal to the thickness of said second insulative spacer, and said drain region being spaced from said gate electrode by a second distance substantially equal to the sum of the thickness of said first and third spacers.

2. A method according to claim 1, wherein said first step includes a substep of doping N-type impurities into a GaAs substrate.

3. A method according to claim 2, wherein said second step includes a first substep of forming a first metal portion on said active region and a second substep of forming a second metal portion on said first metal portion, said first and second metal portions cooperatively serving as said gate electrode.

4. A method according to claim 3, wherein said first substep includes a substep of forming a first metal layer on said active region, a substep of forming a support layer on a portion of said first metal layer, said support layer being thicker than said first metal layer, a substep of covering said support layer and said first metal layer with a second metal layer, and a substep of anisotropically etching said second and first metal layers until said active region is exposed to provide a portion of said second metal layer along a side surface of said support layer as said second metal portion.

5. A method according to claim 4, wherein said third step includes a substep of covering said support layer, second metal portion and active region with a second insulative layer, and a substep of anisotropically etching said second insulative layer until said support layer is exposed to provide a portion of said second insulative layer along side surfaces of said first metal layer and second metal portion to form said first insulative spacer.

6. A method according to claim 5, wherein said second substep further includes a substep of removing said support layer from said first metal layer, and a substep of forming said first metal portion by anisotropically etching said first metal layer, with said second metal portion used as a mask, until said active region is exposed to provide a portion of said first metal layer under said second metal portion.

7. A method according to claim 1, wherein said second distance is at least twice said first distance.

* * * * *